United States Patent
Kurusu et al.

(10) Patent No.: US 6,303,950 B1
(45) Date of Patent: Oct. 16, 2001

(54) FIELD EFFECT TRANSISTOR INCLUDING STABILIZING CIRCUIT

(75) Inventors: Hitoshi Kurusu; Junichi Udomoto, both of Toyko (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/511,248

(22) Filed: Feb. 23, 2000

(30) Foreign Application Priority Data

Jul. 29, 1999 (JP) .................................................. 11-215146

(51) Int. Cl.⁷ .......................... H01L 29/80; H01L 31/112; H01L 29/76; H01L 29/94; H01L 31/062
(52) U.S. Cl. .......................... 257/287; 257/275; 257/277; 257/379; 257/401
(58) Field of Search ..................................... 257/275, 277, 257/287, 341, 379, 401

(56) References Cited

U.S. PATENT DOCUMENTS 6,177,834 * 1/2001 Blair et al. ............................ 327/566

FOREIGN PATENT DOCUMENTS

| 6120414 | 4/1994 | (JP) . |
| 9283710 | 10/1997 | (JP) . |
| 1083998 | 3/1998 | (JP) . |

* cited by examiner

Primary Examiner—Ngân V. Ngô
(74) Attorney, Agent, or Firm—Leydig, Voit & Mayer, Ltd.

(57) ABSTRACT

A field effect transistor (FET) having a stabilization circuit with a stabilization condition not affected by another circuit element, for example, a matching circuit. The stabilization circuit is pre-formed inside of the FET, thereby pre-stabilizing the FET in a frequency range in which a power amplifier is used.

12 Claims, 5 Drawing Sheets

FIELD EFFECT TRANSISTOR INCLUDING STABILIZING CIRCUIT

BACKGROUND OF THE INVENTION

The present invention relates to a field effect transistor (FET) used for a power amplifier and, more particularly, to an FET comprising a stabilization circuit between a connecting portion of a gate electrode and a source electrode.

A power amplifier with an FET is required the FET to be stabilized, without oscillating in a frequency range in which the power amplifier is used. Therefore, the typical power amplifier includes a stabilization circuit in order to stabilize the FET.

FIG. 9 shows a circuit diagram of a conventional power amplifier comprising an external stabilization circuit 34. As shown in the drawing, an input matching circuit 32 is connected to an input terminal of the FET 31, and an output matching circuit 33 is connected to its output terminal. An external stabilization circuit 34 is connected between a gate electrode and the input matching circuit 32 of the FET 31, so that the power amplifier is stabilized. The external stabilization circuit 34 is designed according to a measurement of S parameters of the FET 31.

In this arrangement, an input matching circuit 32 as well as the external stabilization circuit 34 are formed in the circuit of the power amplifier. In this instance, the external stabilization circuit 34 can be arranged close to other circuit elements. This results in an interaction between the external stabilization circuit 34 designed according to the S parameters interact with other circuit elements to dissatisfy the stabilization requirements, which disadvantageously causes oscillation the FET 31.

SUMMARY OF THE INVENTION

Accordingly, an object of the present invention is to provide an FET having a stabilization circuit whose stabilization condition will not be affected by an other circuit element, for example, a matching circuit.

To this end, the inventors of the present invention have made intensive researches on this subject. As a result, the inventors have found that, by forming a stabilization circuit in an FET and thereby pre-stabilizing the FET in a frequency range in which a power amplifier is used, no variation will occur in a stabilization requirement for the FET, which would otherwise be caused by arranging another circuit in the vicinity of the FET.

That is, present invention provides a field effect transistor for use in a power amplifier, comprising: at least one unit including gate, source, and drain electrodes; and wherein said gate electrode includes a finger portion extending between said source and drain electrode; a connecting portion electrically connecting said finger electrode to a common electrode; and a stabilizing circuit electrically connecting said connecting portion to said source electrode in the same unit.

The stabilization circuit is pre-formed to connect between the gate electrode and the connecting portion, so that no external stabilization circuit for the field effect transistor is needed on the designing process of the power amplifier. This means that, only the impedance matching to the FET at the input and output terminals is considered in the designing of the power amplifier.

Also, this prevents an interaction between microwaves passing through the stabilization circuit and the matching circuit or the like. Thereby, a predetermined microwave characteristic can be provided to the power amplifier.

Also, the present invention provide the field effect transistor, wherein said connecting portion extends vertically from said common electrode in a comb-like fashion.

By providing the stabilization circuits between each of the connecting portions and the electrode portion respectively, the interaction between microwaves passing through the stabilization circuit and a matching circuit or the like can be prevented.

The stabilization circuit preferably includes a resistor and a capacitor, the resistor and capacitor being connected in series.

The capacitor is preferably an MIM capacitor.

The finger portion preferably has a first and second layers positioned one on top the other, said first layer being made of tungsten silicide and said second layer being made of gold, and said resistance has a third layer made of tungsten silicide and also formed in the formation of said first layer.

It is because a producing process can be simplified by using such a resistor.

It is preferable that the field effect transistor further comprises a substrate having first and second surfaces, said first surface supporting said source electrode and said second surface supporting another electrode, said substrate being formed with a via-hole extending between said first and second surfaces for electrically connecting said source and another electrodes.

It is because the source electrodes of the field effect transistor have the same electric potential.

Also, the present invention provides a monolithic microwave integrated circuit, which comprises the field effect transistor mentioned above.

It is because the use of the field effect transistor allows the monolithic microwave integrated circuit to eliminate the stabilization circuit as the external circuit of the field effect transistor.

Also, the present invention provide a method for designing a power amplifier having a field effect transistor, comprising the steps of: (a) providing said field effect transistor having a stabilizing circuit which stabilizes said field effect transistor in a frequency range in which said power amplifier operates; and (b) designing an input matching circuit so that an input impedance of said field effect transistor matches with an impedance of a circuit connected to a input terminal of said field effect transistor, and an output matching circuit so that an output impedance of said field effect transistor matches with an impedance of a circuit connected to an output terminal of said field effect transistor in a frequency range in which said power amplifier operates.

By using the designing method of the present invention, no consideration should be made to stabilize the field effect transistor, except for the matching of the impedance at input and output terminals of the field effect transistor. This simplifies the designing process and increases the design efficiency.

The step (a) preferably comprises preparing a plurality of said field effect transistors having respective gates each of which having different widths; and said step (b) is preferably performed for each of said plural field effect transistors.

As can be seen from the above description, the FET of the present invention comprises the stabilization circuit in the FET. Therefore, in the process of designing the power amplifier, no need should be made to design the stabilization circuit, which considerably simplifies the design process of the power amplifier.

Also, an interaction between microwaves passing through a matching circuit or the like formed outside of the FET and

DETAILED DESCRIPTION OF THE PREFERRED EMBODIMENTS

Embodiment 1

Figure 1:
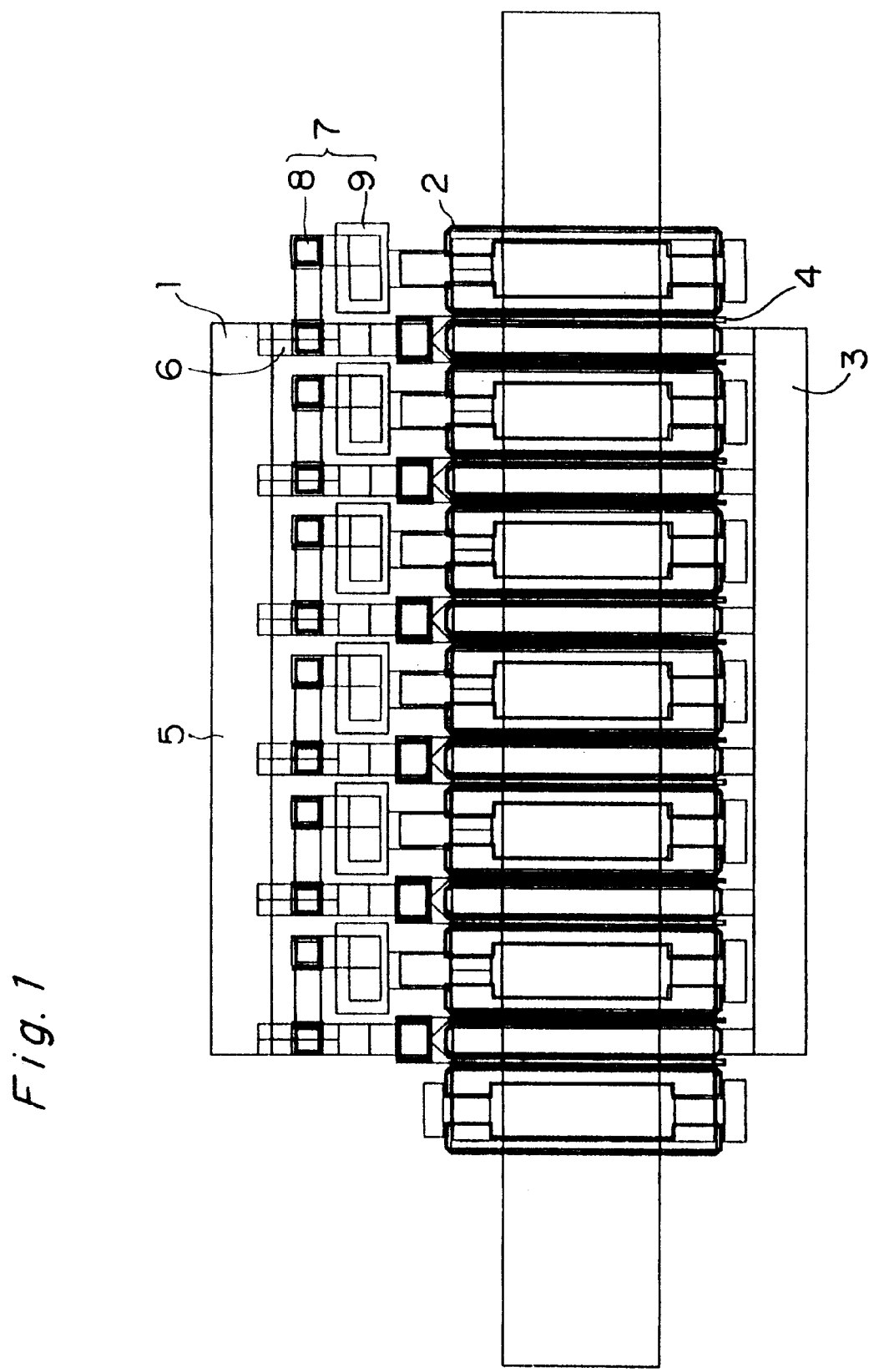
FIG. 1 is a plan view of an FET of the first embodiment according to the present invention.

FIG. 1 is a plan view of an FET according to the present invention, which comprises an internal stabilization circuit in the FET. As shown, the FET is a multi-finger type FET having a gate electrode 1 in the form of a comb. The gate electrode 1 has a finger portion 4 which is located between a source electrode 2 and a drain electrode 3 facing each other. The gate electrode 1 also comprises an electrode portion 5 which connects the gate electrode 1 to an external circuit not shown. The finger portion 4 and the electrode portion 5 are connected by a connecting portion 6. Formed between the connecting portion 5 and the source electrode 2 is a stabilization circuit 7 comprising a resistor 8 and a capacitor 9.

Figure 2:
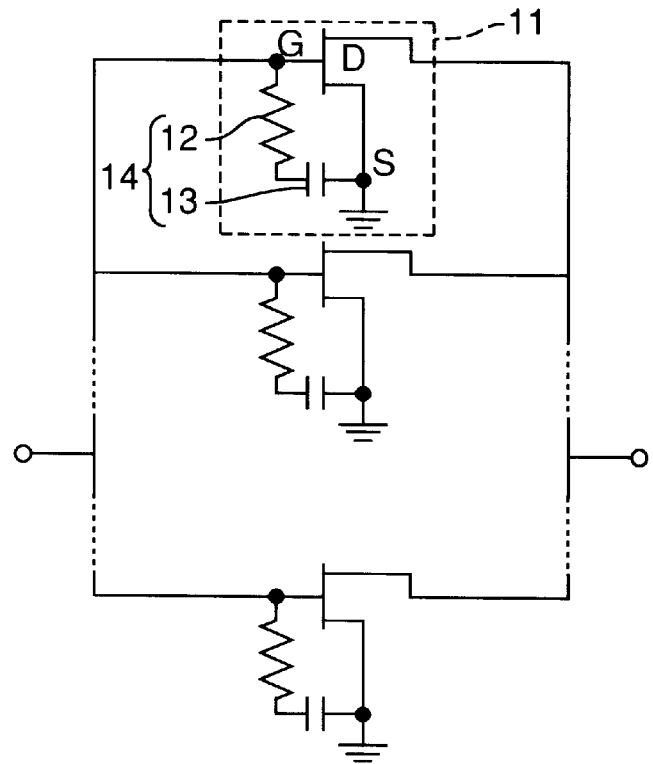
FIG. 2 is an equivalent circuit diagram of the FET of the first embodiment according to the present invention.

FIG. 2 is an equivalent circuit diagram of the FET in FIG. 1. As shown, the FET in FIG. 1 has a plurality of FET units 11 connected in a parallel. Each of the FET units 11 comprises an FET having a gate (G), a source (S) and a drain (D). Also, included in each of the FET units 11 is an internal stabilization circuit 14 having a resistor 12 and the capacitor 13 connected between the gate and the source.

Figure 3:
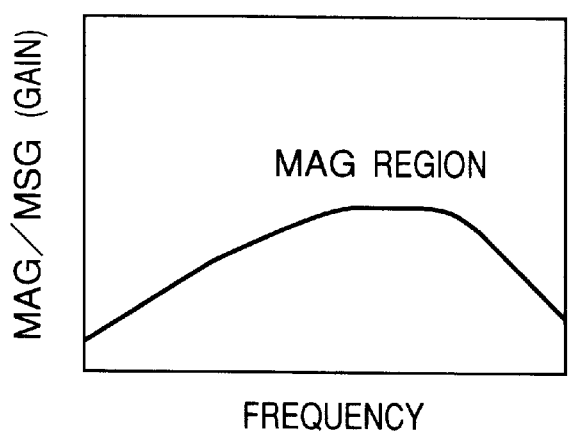
FIG. 3 is a graph showing a frequency versus gain characteristic of the FET of the first embodiment according to the present invention.

FIG. 3 shows a frequency characteristic of the FET shown in the equivalent circuit diagram of FIG. 2, on which the abscissa represents frequency of a signal applied to the FET and the ordinate represents a gain of the FET. The gain is indicated as MAG (Maximum Available Gain) in a frequency range in which the FET does not oscillate. It is indicated as MSG (Maximum Stable Gain) in a frequency range in which the FET oscillates. It is to be understood that, the power amplifier should be designed in the frequency range in which the gain of the FET stands in the MAG range. For this purpose, it is advantage that the MAG range is extended in a wide frequency range.

As shown in FIG. 3, the gain of the FET shown in FIG. 2 stands in the MAG range in the entire range of the frequency. Therefore, in the case of designing the power amplifier using the FET, no consideration should be made to the stabilization of the FET, except for the matching of the impedance at input and output terminals of the FET.

It should be noted that the gain (MAG) in a predetermined frequency range can be increased by suitably selecting the characteristics of the resistor 12 and the capacitor 13 mounted in the internal stabilization circuit 14.

Thus, as indicated in the equivalent circuit diagram shown in FIG. 2, the stabilization circuit to stabilize the FET is mounted in each of FET units 11, each constituting respective parts of the FET. Accordingly, for using the FET to construct the power amplifier, no stabilization circuit for stabilizing the FET is needed. This means that, only the impedance matching to the FET at the input and output terminals is considered in designing the power amplifier.

Further, the existence of the stabilization circuit 14 in each of the FET units 11 allows each distance between the stabilization circuit 14 and a matching circuit or the like which is formed outside of the FET to be increased. This in turn prevents an interaction between microwaves passing through the stabilization circuit and the matching circuit or the like. Thereby, a predetermined high-frequency characteristic can be provided to the power amplifier which comprises the FET of the present embodiment.

Figure 4:
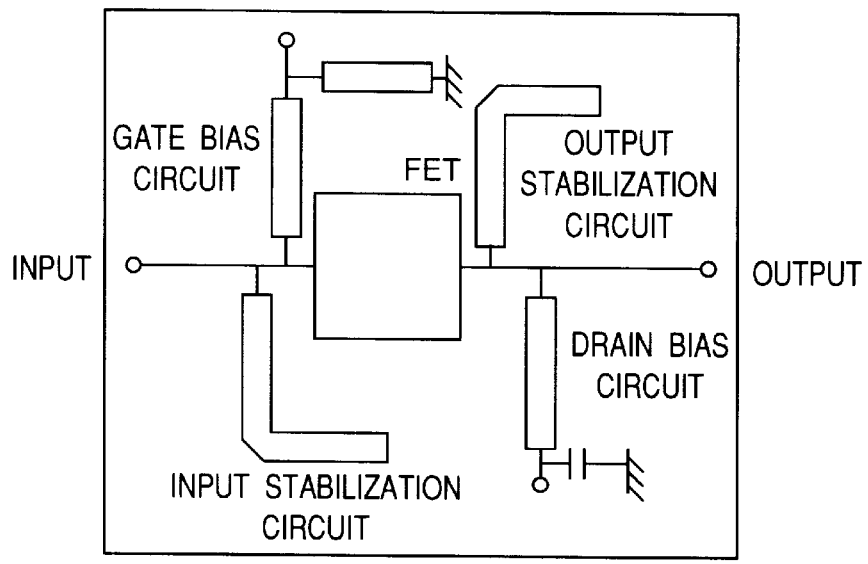
FIG. 4 is a plan view of an MMIC comprising the FET of the first embodiment according to the present invention.

FIG. 4 is a plan view of a monolithic microwave integrated circuit, which is referred as a MMIC hereinafter, comprising the FET described above. As can be seen from the drawing, the use of the FET allows the MMIC to eliminate the stabilization circuit as the external circuit of the FET.

In a typical design process of the power amplifier, a plurality of FETs each having different gate widths are provided. Each of these FETs comprises an internal stabilization circuit which stabilizes the FET at a predetermined frequency. Next, input and output matching circuits are designed and then formed for each FET.

In this manner, the internal stabilization circuit is pre-formed, which ensures that an oscillation caused by the interaction of microwaves is prevented. Further, no consideration needs to be given to stabilizing the FET in the design process, which in turn increases the design efficiency, i.e., shortening the design time for the power amplifier.

COMPARATIVE EXAMPLE

Figure 5:
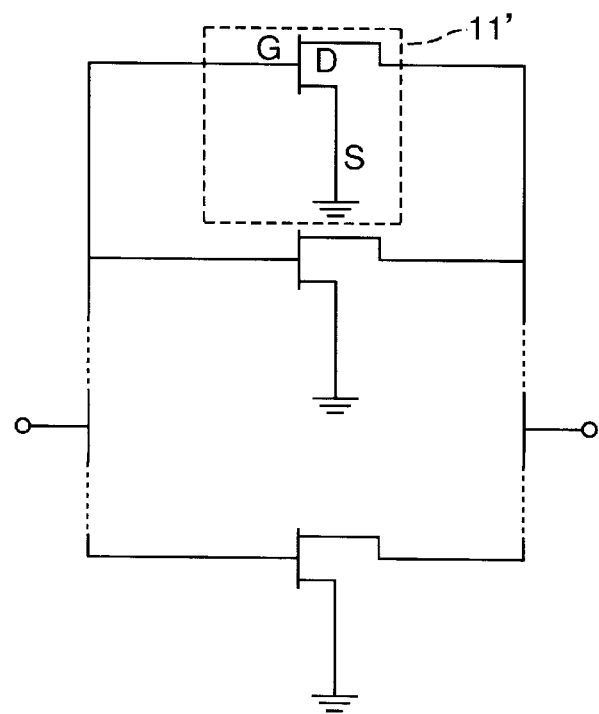
FIG. 5 is an equivalent circuit diagram of a conventional FET.

FIG. 5 is conventional equivalent circuit diagram of a multi-finger type. The FET comprises a plurality of FET units 11' which are connected in a parallel fashion. Each of the FET units 11' comprises an FET having a gate (G), a source (S) and a drain (D). Differing from the FET shown in FIG. 2, an internal stabilization circuit is not included in each of the FET units 11', while the stabilization circuit is formed outside of the multi-finger type FET.

Figure 6:
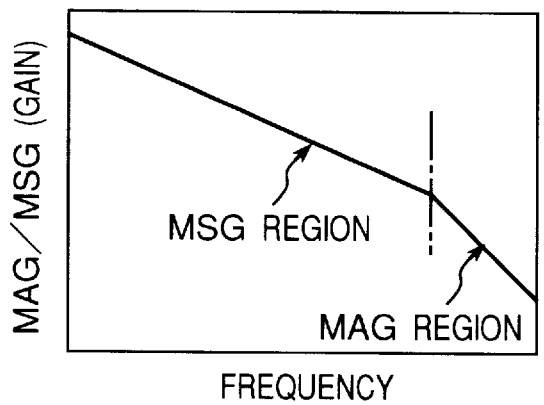
FIG. 6 is a graph showing a frequency versus gain characteristics of the conventional FET.

FIG. 6 shows frequency characteristic of the FET shown in the equivalent circuit diagram of FIG. 5, on which the abscissa represents a frequency applied to the FET and the ordinate represents a gain of the FET.

As can be seen from drawing, both of the MAG region in which no oscillation of the FET is occurred and the MSG region in which the oscillation of the FET is occurred are appeared by using the FET shown in FIG. 5. In particularly, the frequency range of the MSG region is wider than that of the MAG region in this comparative example.

Therefore, in the case of designing a power amplifier by using the FET of FIG. 5, the external stabilization circuit in the outside of the FET is needed for standing the gain of the FET in the MAG region.

Figure 9:
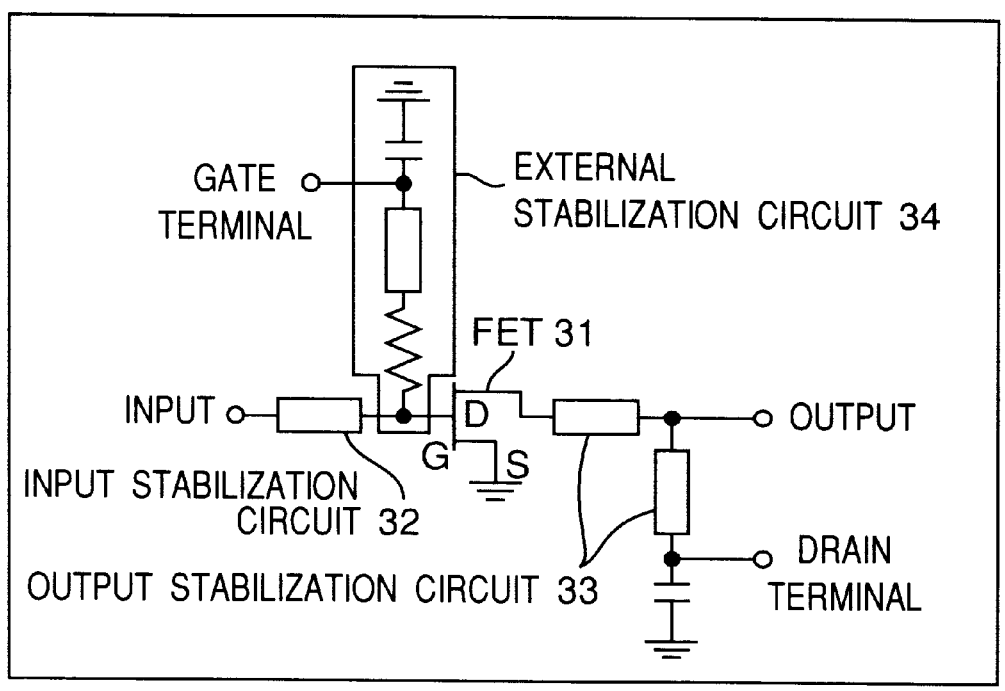
FIG. 9 is a circuit diagram of a conventional power amplifier.

In the case of forming an external stabilization circuit 34 shown in FIG. 9, however, interaction of microwaves is occurred, for example, between the microwaves passing through the external stabilization circuit 34 and an input matching circuit 32. This is because that the distance between the external stabilization circuit 34 and the input matching circuit 32 is small. Causing by the interaction of the microwaves, a predetermined microwave characteristic of the power amplifier can not be obtained.

Embodiment 2

Figure 7:
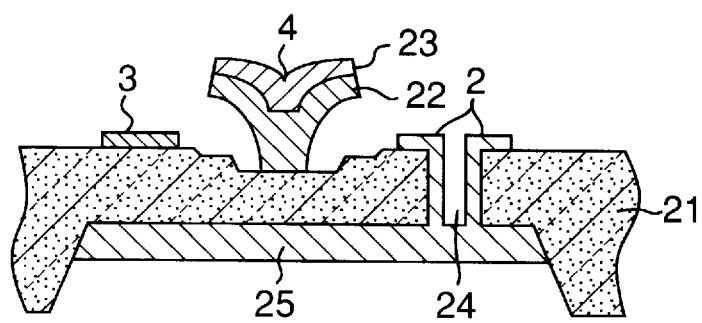
FIG. 7 is a partial sectional view of an FET of the second embodiment according to the present invention.

FIG. 7 is a partial sectional view of an FET unit of the second embodiment according to the present invention. The FET unit comprises a finger portion 4 of a gate electrode 1, a source electrode 2 and a drain electrode 3, each of which are formed on a front surface of the a semiconductor substrate 21. The finger portion 4 has a lower layer of a tungsten silicide (WSi) electrode 22 and an upper layer of a gold electrode 23. A via hole 24, which is provided with a conductive layer in its surfaces, is formed to penetrate the semiconductor substrate 21. An electrode 25 made of gold is formed on a back surface of the semiconductor substrate 21. The source electrode 2 and the back electrode 25 are electrically connected by the via hole 24.

A plurality of the FET units shown in FIG. 7 are connected in parallel, so that the FET shown in FIG. 1 is constructed. Also, each of the source electrodes 2 in the FET is electrically connected to the back electrode 25 through the via holes 24, so that the source electrodes 2 have the same electric potential. The FET is called as a source island via-hole TUB structure FET (SIVTUB-FET).

Also, a stabilization circuit (not shown) comprising a resistor and a capacitor is formed between a connecting portion (not shown) of the gate electrode 4 and the source electrode 2.

Embodiment 3

Figure 8:
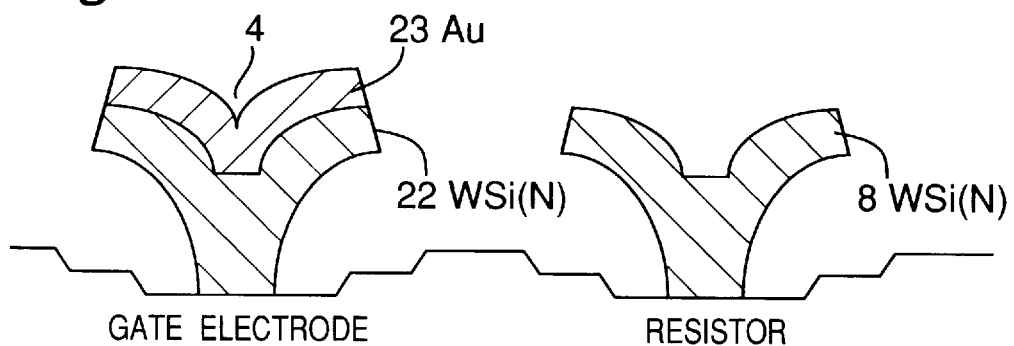
FIG. 8 is a partial sectional view of an FET of the third embodiment according to the present invention.

FIG. 8 is a partial sectional view of a finger portion 4 of a gate electrode and a resistor 8 of a stabilization circuit in the FET of the third embodiment according to the present invention. The finger portion 4 shown has a lower electrode 22 of tungsten silicide and an upper electrode 23 of gold. The resistor 8 has a tungsten silicide electrode which serves as the lower electrode 22 of the finger portion 4. Tungsten silicide has a higher resistivity than that of gold, so that its layer can be used as a resistor.

The resistor 8 is formed at the predetermined location in the same manner as the lower electrode 22 of the finger portion 4 by, for example, spattering. Then, the resistor 8 is covered with, for example, a photo resist layer. Subsequently, a gold layer is deposited on the lower electrode 22 to form an upper electrode 23.

According to this embodiment, the resistor 8 and the lower electrode 22 of the finger portion 4 are formed simultaneously, which simplifies the manufacturing process of the FET.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A field effect transistor including a stabilizing circuit comprising:

a semiconductor substrate having opposed first and second surfaces;

at least one field effect transistor unit, the field effect transistor unit including a field effect transistor comprising:

a source electrode on the first surface of said substrate, a drain electrode on the first surface of said substrate, a gate electrode on the first surface of said substrate, said gate electrode having a finger portion extending between said source and drain electrodes, and a connecting portion extending beyond said source and drain electrodes, and a stabilizing circuit located on the first surface of said substrate adjacent said source electrode and the connecting portion of said gate electrode; and a common gate connecting electrode, the connecting portions of each of said gate electrodes of each of said field effect transistor units extending to and being connected to said common gate connecting electrode, wherein said stabilizing circuit of each of said field effect transistor units is located between said common gate connecting electrode and said source electrode of the respective field effect transistor unit.

2. The field effect transistor according to claim 1, wherein no connection of any stabilizing circuit crosses any of said source electrodes, said drain electrodes, and connections to said source electrodes and to said drain electrodes, of any of said field effect transistor units.

3. The field effect transistor according to claim 2, wherein said connecting portion is perpendicular to said common gate connecting electrode in a comb configuration.

4. The field effect transistor according to claim 2, wherein each of said stabilizing circuits includes a resistor and a capacitor, said resistor and said capacitor being connected in series.

5. The field effect transistor according to claim 4, wherein said capacitor is an MIM capacitor.

6. The field effect transistor according to claim 4, wherein said finger portion includes first and second layers, said second layer being positioned on top of said first layer, said first layer being tungsten silicide and said second layer being gold, and said resistor includes a third layer of tungsten silicide formed at the same time as said first layer.

7. The field effect transistor according to claim 2, including a rear electrode on the second surface and said substrate includes a via-hole extending between the first and second surfaces, electrically connecting said source electrode to said rear electrode on the second surface.

8. The field effect transistor according to claim 1, wherein said connecting portion is perpendicular to said common gate connecting electrode in a comb configuration.

9. The field effect transistor according to claim 1, wherein each of said stabilizing circuits includes a resistor and a capacitor, said resistor and said capacitor being connected in series.

10. The field effect transistor according to claim 9, wherein said capacitor is an MIM capacitor.

11. The field effect transistor according to claim 9, wherein said finger portion includes first and second layers, said second layer being positioned on top of said first layer, said first layer being tungsten silicide and said second layer being gold, and said resistor includes a third layer of tungsten silicide formed at the same time as said first layer.

12. The field effect transistor according to claim 1, including a rear electrode on the second surface and said substrate includes a via-hole extending between the first and second surfaces, electrically connecting said source electrode to said rear electrode on the second surface.

* * * * *